US008866238B2

(12) United States Patent  (10) Patent No.: US 8,866,238 B2
Classen  (45) Date of Patent: Oct. 21, 2014

(54) HYBRID INTEGRATED COMPONENT AND METHOD FOR THE MANUFACTURE THEREOF

(71) Applicant: Johannes Classen, Reutlingen (DE)

(72) Inventor: Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/869,692

(22) Filed: Apr. 24, 2013

(65) Prior Publication Data

US 2013/0285166 A1  Oct. 31, 2013

(30) Foreign Application Priority Data

Apr. 25, 2012  (DE) .......................... 10 2012 206 854

(51) Int. Cl.
*H01L 29/84* (2006.01)
*H01L 21/50* (2006.01)
*B81C 1/00* (2006.01)
*B81B 3/00* (2006.01)
*B81C 3/00* (2006.01)
*B81B 7/00* (2006.01)

(52) U.S. Cl.
CPC ......... *B81B 3/004* (2013.01); *B81C 2203/0735* (2013.01); *B81B 3/0018* (2013.01); *B81C 1/00246* (2013.01); *B81C 2203/0109* (2013.01); *B81B 3/0075* (2013.01); *B81C 1/00261* (2013.01); *B81C 3/001* (2013.01); *B81C 2203/0771* (2013.01); *B81C 1/00674* (2013.01); *B81C 1/00134* (2013.01); *B81B 7/008* (2013.01)
USPC ........... 257/416; 257/226; 257/254; 257/415; 257/417; 257/418; 257/424; 257/E21.192; 257/E21.247; 257/E21.449; 257/E29.324; 438/50; 438/51; 438/455; 438/456

(58) Field of Classification Search
CPC .... B81B 3/004; B81B 3/0018; B81B 3/0075; B81B 7/008; B81C 1/00134; B81C 1/00246; B81C 1/00261; B81C 1/00674; B81C 2203/0109; B81C 2203/0735; B81C 2003/0771
USPC ......... 257/226, 254, 415, 416, 417, 418, 424; 257/E21.192, E21.247, E21.449, E29.324; 438/50, 51, 455, 456
See application file for complete search history.

(56) References Cited

U.S. PATENT DOCUMENTS 7,456,042 B2 * 11/2008 Stark et al. ...................... 438/50
8,587,077 B2 * 11/2013 Chen ............................. 257/416

(Continued)

*Primary Examiner* — Dao H Nguyen
(74) *Attorney, Agent, or Firm* — Kenyon & Kenyon LLP

(57) ABSTRACT

Hybrid integrated components including an MEMS element and an ASIC element are described, whose capacitor system allows both signal detection with comparatively high sensitivity and sensitive activation of the micromechanical structure of the MEMS element. The hybrid integrated component includes an MEMS element having a micromechanical structure which extends over the entire thickness of the MEMS substrate. At least one structural element of this micromechanical structure is deflectable and is operationally linked to at least one capacitor system, which includes at least one movable electrode and at least one stationary electrode. Furthermore, the component includes an ASIC element having at least one electrode of the capacitor system. The MEMS element is mounted on the ASIC element, so that there is a gap between the micromechanical structure and the surface of the ASIC element. According to the invention, at least one electrode of the capacitor system is separated from the layered structure of the ASIC element and instead mechanically and electrically connected to the deflectable structural element of the MEMS element, so that this electrode functions as a movable electrode of the capacitor system.

19 Claims, 11 Drawing Sheets

(56) References Cited

U.S. PATENT DOCUMENTS

| | | | |
|---|---|---|---|
| 2003/0001221 A1* | 1/2003 | Fischer et al. | 257/417 |
| 2008/0128901 A1* | 6/2008 | Zurcher et al. | 257/724 |
| 2011/0049652 A1 | 3/2011 | Wu et al. | |
| 2013/0307096 A1* | 11/2013 | Classen et al. | 257/418 |
| 2013/0334621 A1* | 12/2013 | Classen et al. | 257/415 |
| 2014/0110800 A1* | 4/2014 | Classen et al. | 257/415 |

* cited by examiner

HYBRID INTEGRATED COMPONENT AND METHOD FOR THE MANUFACTURE THEREOF

FIELD OF THE INVENTION

The present invention relates to a hybrid integrated component, which includes at least one MEMS (micro-electromechanical system) element having a micromechanical structure, which extends over the entire thickness of the MEMS substrate. At least one structural element of this micromechanical structure is deflectable and is operationally linked to a capacitor system, which includes at least one movable electrode and at least one stationary electrode. In addition, the component also includes an ASIC element having at least one electrode of the capacitor system. The MEMS element is mounted on the ASIC element, so that there is a gap between the micromechanical structure and the surface of the ASIC element.

Furthermore, the present invention also relates to a method for manufacturing such a hybrid integrated component.

BACKGROUND INFORMATION

Components having MEMS elements have been manufactured in mass production for many years for greatly varying applications, for example, in the fields of automotive engineering and consumer electronics. The miniaturization of the components is increasingly gaining in significance. On the one hand, the miniaturization substantially contributes to reducing the manufacturing costs of the components and therefore also of the terminal equipment. On the other hand, in particular in the field of consumer electronics, more and more functions—and therefore components—are to be accommodated in the terminal equipment, while the terminal equipment itself becomes smaller and smaller. Therefore, less and less space is available on the application circuit boards for the individual components.

Various miniaturization concepts for sensor components are known from practice, which provide an integration in one component of the sensor function implemented by micromechanics and the circuitry-wise processing and evaluation of the sensor signals. In addition to the lateral integration of the MEMS function and the ASIC function on a shared chip, there are also already concepts for so-called vertical hybrid integration, according to which a chip stack is formed from ASIC, MEMS, and a cap wafer.

Such a vertically integrated component and a method for the manufacture thereof are described in United States Published Patent Application No. 2011/0049652. The known method provides bonding the starting substrate for the MEMS element on an already processed ASIC substrate. A micromechanical structure, which includes at least one deflectable structural element, is only produced thereafter in the MEMS substrate. Independently thereof, a cap wafer is structured and prepared for the mounting over the micromechanical structure of the MEMS substrate and on the ASIC substrate. The cap wafer thus processed is bonded on the ASIC substrate after the structuring of the MEMS substrate, so that the micromechanical structure is enclosed hermetically sealed between the ASIC substrate and the cap wafer.

The component described in United States Published Patent Application No. 2011/0049652 is equipped with a capacitor system, which—depending on the MEMS function—may be used as a drive for moving the deflectable structural element or also for detecting externally caused deflections of the structural element. For this purpose, the capacitor system includes at least one deflectable electrode, which is located here on the deflectable structural element of the MEMS element, and stationary electrodes, which are implemented here in a structured metal layer on the surface of the ASIC substrate.

The known component concept allows cost-effective mass production of robust components having a micromechanical function and a signal processing circuit, since here not only the individual component parts—MEMS element, cap, and ASIC—are manufactured in the wafer composite, but rather also their assembly is implemented to form a component on the wafer level. The MEMS functions and ASIC functions may be tested on the wafer level, and even the calibration of the individual components may take place before the separation on the wafer level. In addition, the known components require a comparatively small mounting area due to the stacked construction, which has a favorable effect on the manufacturing costs of the terminal equipment.

The positioning of the electrodes of the capacitor system, on the one hand, on the lower side of the MEMS element and, on the other hand, in the uppermost metal level of the ASIC element, has proven to be problematic. Since the capacitance of such a capacitor system is inversely proportional to the distance between the opposing electrodes and the gap between the two elements is generally relatively large, the capacitance of the capacitor system is relatively small here at a given electrode area. The measuring sensitivity is accordingly relatively low if the capacitor system is used for measuring purposes. If the capacitor system is used for activating the movable structural element, a comparatively high voltage must thus be applied to achieve a predefined deflection.

The capacitor system of the known component additionally may not be readily supplemented by a third electrode level for fully differentiated signal detection or activation. It would have to be situated here on the lower side of the cap, i.e., also at a relatively large distance.

SUMMARY

Measures for implementing hybrid integrated components of the type mentioned at the outset are proposed by the present invention, whose capacitor system allows both signal detection having a comparatively high sensitivity and sensitive activation of the micromechanical structure of the MEMS element.

For this purpose, according to the present invention, at least one electrode of the capacitor system is separated from the layered structure of the ASIC element and instead mechanically and electrically connected to the deflectable structural element of the MEMS element, so that this electrode functions as the movable electrode of the capacitor system.

In contrast to the component structure known from United States Published Patent Application No. 2011/0049652, the movable electrode of the capacitor system is accordingly displaced from the level of the MEMS structure into the ASIC level, i.e., from one side of the gap between the MEMS element and the ASIC element to the other side of this gap, where at least one stationary electrode of the capacitor system is reasonably also located. In this way, capacitor systems may be implemented in which the distance between movable and stationary electrodes is independent of the gap width between the elements and therefore may also be significantly smaller than this gap. In addition, with appropriate arrangement of multiple stationary electrodes, differential capacitor systems having three electrode levels may also be easily implemented. The movable electrode is situated between at least two stationary electrodes in such a way that in the event of a deflection of the movable electrode, the distance to one of the two stationary electrodes decreases, while the distance to the other stationary electrode increases to the same extent.

Each capacitor system of a component according to the present invention may accordingly, in addition to the level of the movable electrode, include another electrode level for stationary electrodes or also two other electrode levels for stationary electrodes, if it is a differential capacitor system. Such an electrode level may be integrated into the layered structure of the MEMS element, for example. In a preferred specific embodiment of the component according to the present invention, however, at least one electrode level for stationary electrodes is integrated into the layered structure of the ASIC element. As already mentioned, particularly small electrode distances may be implemented in this way. Accordingly, such capacitor systems have a comparatively large capacitance in the case of an electrode area limited by the chip size.

According to the claimed method for manufacturing such a hybrid integrated component, an ASIC substrate is initially processed. At least one electrode of at least one capacitor system is also already applied at this time. A MEMS substrate is then mounted on the ASIC substrate. Within the scope of the processing of this MEMS substrate, at least one through contact is produced for the mechanical and electrical connection of the at least one electrode applied in the ASIC substrate. In addition, a micromechanical structure is produced, which extends over the entire thickness of the MEMS substrate. At least one structural element of this micromechanical structure is exposed on the ASIC side. In addition, the at least one electrode, which is applied in the ASIC substrate and connected via the at least one through contact to this structural element, is separated from the composite of the ASIC substrate.

The application of electrode levels for movable and stationary electrodes in the ASIC substrate is preferably carried out within the scope of a known CMOS process. A layered structure is produced on a starting substrate, which includes multiple metal layers, which are embedded in at least one insulating layer and structured, and a structured metal layer on the ASIC front side. The electrodes of the individual electrode levels are implemented during the structuring of these metal layers.

Establishing the electrical connection between individual chips of a chip stack via so-called through contacts is known. For this purpose, passage openings are produced in the affected chip and filled using an electrically conductive material, for example, tungsten or copper. In one advantageous specific embodiment of the present invention, the mechanical and electrical connection between the deflectable structural element and an electrode applied in the ASIC substrate is established via at least one such through contact, which extends through the entire thickness of the micromechanical structure and over the gap between the MEMS element and the ASIC element.

The component concept according to the present invention is particularly suited for the implementation of sensors which operate in a contactless manner, for example, acceleration sensors, yaw rate sensors, and other inertial sensors. In the case of an inertial sensor, the micromechanical sensor structure includes at least one resiliently suspended seismic mass, which is deflected due to accelerations. These accelerations may also be induced by centrifugal forces or rotational movements. Since the micromechanical structure of the MEMS element extends according to the present invention over the entire thickness of the MEMS substrate, very large seismic masses may be implemented here on a comparatively small chip area, which has an advantageous effect on the measuring sensitivity. In addition, the deflections of the seismic mass may be detected very precisely with the aid of the capacitor system according to the present invention. The essential circuit parts for the processing and evaluation of the measuring signals are advantageously integrated on the ASIC element, so that the MEMS sensor element and the ASIC element form a functional unit.

The micromechanical structure of such a sensor element should be capped in order to minimize environmental influences on the measuring signal and to protect the sensor structure against contaminants, moisture, and particles. In addition, defined pressure conditions for the sensor structure may be created in this way, which substantially codetermine the damping behavior of the sensor. Such capping may be achieved, for example, in that the wafer stack, including ASIC substrate and processed MEMS substrate, is provided with a pre-structured cap wafer, so that the micromechanical structure is enclosed hermetically sealed between the ASIC substrate and the cap wafer.

The manufacturing method according to the present invention may be varied in manifold ways, in particular with regard to the processing of the individual elements, but also with regard to the mechanical and electrical connection between the individual elements and the external electrical contacting of the resulting component. The function, determination, and mounting location of the component to be manufactured are taken into consideration.

As already mentioned, parts of a signal processing circuit and optionally an evaluation circuit for the MEMS element of the component are preferably integrated on the ASIC element. Of course, the ASIC element may also be equipped with other circuit functions, however. Within the scope of the processing of the ASIC substrate, structuring of the surface, on which the MEMS substrate is to be mounted, may additionally be carried out. Depressions may be produced in the ASIC surface to ensure the mobility of structural elements of the MEMS element.

In a preferred method variant, a pedestal structure is produced on the ASIC surface. The MEMS substrate is mounted on this standoff structure, so that a gap is located between the ASIC substrate and the MEMS substrate. The structuring of the MEMS substrate is then carried out in an etching process, which penetrates through the entire thickness of the MEMS substrate.

The MEMS substrate may also be mounted over at least one sacrificial layer on the front side of the processed ASIC substrate. In this case, the micromechanical structure of the MEMS element may be exposed on the ASIC side in a sacrificial layer etching process, during which the material of the sacrificial layer is removed at least below the deflectable structural element.

The connection between the MEMS substrate and the ASIC substrate is preferably established in a bonding process, since in this way both a hermetically sealed mechanical connection and reliable electrical connections may be implemented between the MEMS element and the ASIC element. An array of known processing variants which have been tested in practice are available for this purpose.

As already mentioned, the micromechanical structure of the MEMS element extends here always over the entire thickness of the MEMS substrate. In the case of most applications, it therefore proves to be meaningful to initially thin the MEMS substrate down to a predefined structural height after the mounting on the ASIC substrate and before the structuring.

The structuring of the MEMS substrate is preferably carried out in a trenching process, since trench structures having a particularly high aspect ratio may be produced using this method.

If the electrodes applied in the ASIC substrate are metal electrodes, the at least one movable electrode of the measuring capacitor system may be separated particularly simply from the composite of the ASIC substrate in a sacrificial layer etching process. The etching attack is carried out here via the trenches in the MEMS substrate, by which the micromechanical structure of the MEMS substrate is defined. The material of the insulating layer is at least regionally removed, without the electrodes themselves being attacked.

The mechanical fixing of the components according to the present invention within the scope of the second level assembly is preferably carried out via the ASIC element. In one advantageous component variant, through contacts, so-called TSVs (through silicon vias) are formed for this purpose in the ASIC element, which allow direct mounting of the component on a circuit board. In addition to the mechanical fixing of the component on the circuit board, an electrical connection to the printed conductors on the circuit board is also established. The external electrical contacting of such a component may also be carried out via wire bonds, however, if corresponding exposed terminal pads are implemented on the ASIC element.

DETAILED DESCRIPTION

Figure 1:
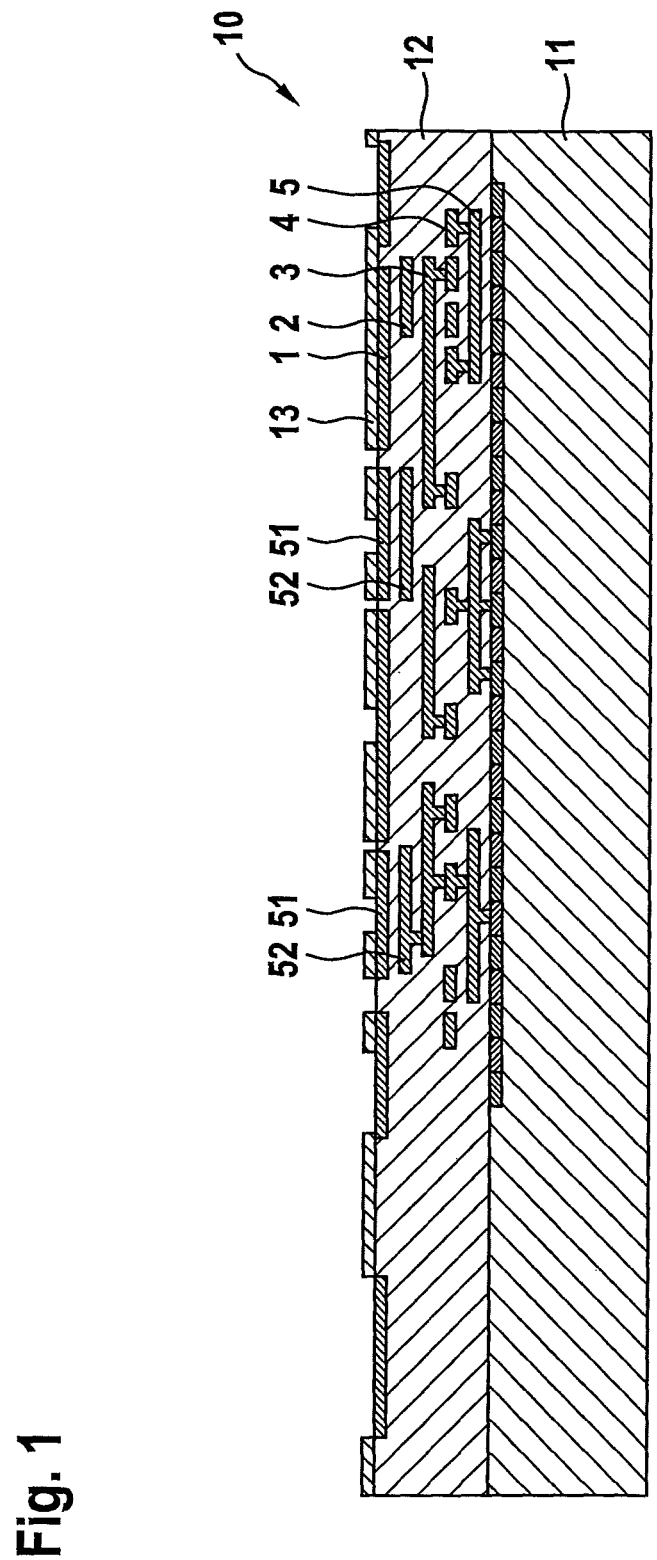
FIGS. 1 through 6 illustrate on the basis of schematic sectional views the manufacture of the MEMS/ASIC wafer stack of a sensor component having a capacitor system corresponding to the component concept according to the present invention.

Within the scope of the method according to the present invention for manufacturing a hybrid integrated component including at least one MEMS element and at least one ASIC element, an ASIC substrate 10 is initially processed. A layered structure having multiple circuit levels 1 through 5 is produced on a starting substrate 11, for example, a semiconductor substrate. These circuit levels 1 through 5 are implemented in the form of structured metal layers 1 through 5, which are spatially and electrically separated from one another and from starting substrate 10 by insulating layers. Since in the exemplary embodiment illustrated here the insulating layers are each oxide layers, a differentiation is not made here between the individual insulating layers. Rather, together these form an insulating layer 12, on which a structured metal layer 1 is situated, remaining metal layers 2 through 5 being embedded in insulating layer 12, as shown in FIG. 1.

According to the present invention, electrodes 51 and 52 of a capacitor system have been applied in each case during the structuring of metal layers 1 and 2. In addition, at least parts of a signal processing and evaluation circuit for the associated MEMS element are advantageously integrated into the circuit levels of ASIC substrate 10. In addition, however, MEMS-independent circuit functions may also be implemented. In any case, all circuit levels on the entire chip area may be used for circuit functions, except for electrode areas 51 and 52 in metal layers 1 and 2. The CMOS processing of ASIC substrate 10 will not be described in detail here, since it is not specified in greater detail by the present invention—except for the application of the electrodes of the capacitor system.

The surface of processed ASIC substrate 10 has been provided here with a nitride passivation 13, which has been structured to allow electrical contacting of uppermost circuit level 1 of ASIC substrate 10, in particular contacting of electrodes 51.

Figure 2:
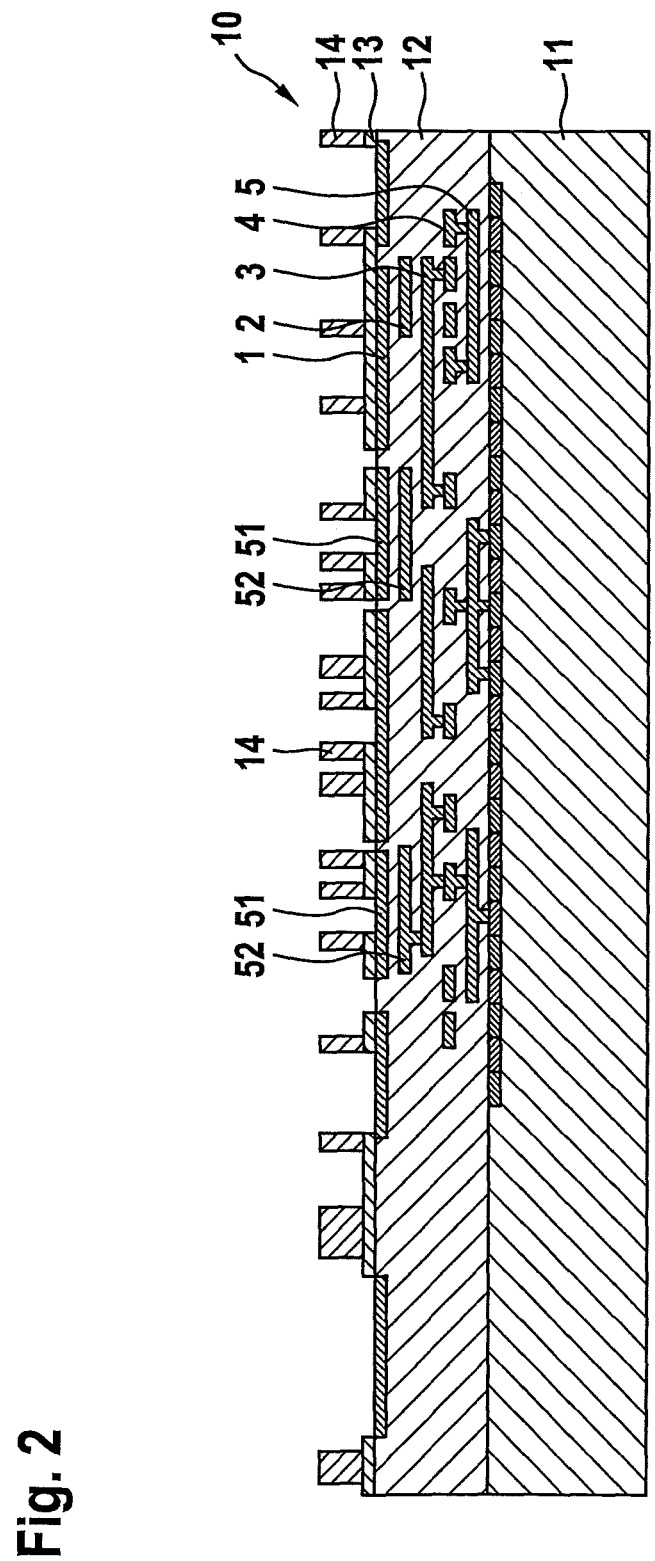

For the mounting of an MEMS substrate, an oxide layer 14 is then deposited on the surface of ASIC substrate 10 and structured. Accesses for the electrical contacting of first circuit level 1 of ASIC substrate 10 and in particular of electrodes 51 are created. In addition, a standoff structure 14 is produced between the ASIC substrate 10 and the MEMS substrate. FIG. 2 shows the result of this structuring process.

Figure 3:
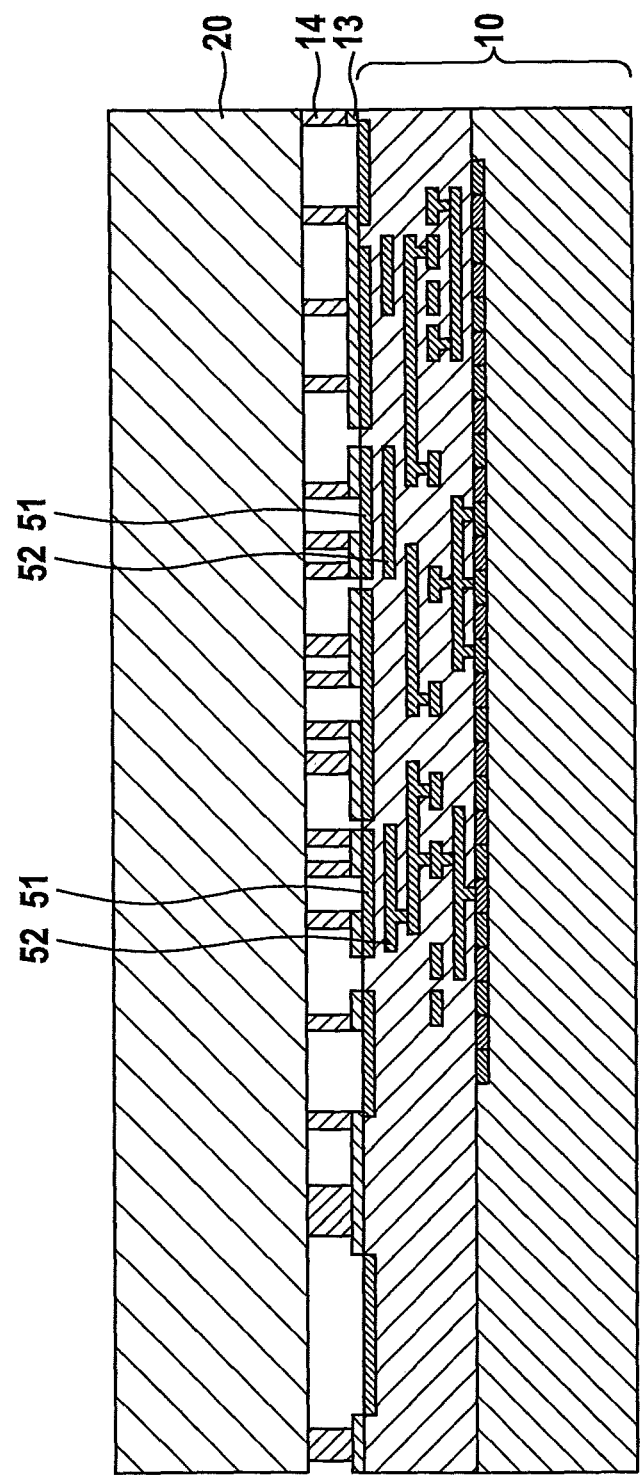

Structured oxide layer 14 forms the mounting surface for an unstructured MEMS substrate 20. The connection between MEMS substrate 20 and ASIC substrate 10 is established here in a plasma-activated direct bonding method and is hermetically sealed. Relatively thick MEMS substrate 20 is now thinned, for example, in a grinding process, until its thickness approximately corresponds to the intended structural height of the MEMS element. This is typically in a range between 10 µm and 150 µm. FIG. 3 shows ASIC substrate 10 having thinned MEMS substrate 20, which is still unstructured, however, and illustrates the function of standoff structure 14 as a space holder between the closed surface of ASIC substrate 10 and MEMS substrate 20.

MEMS substrate 20 is only structured in the composite with ASIC substrate 10. In the present exemplary embodiment, this structuring is carried out in two steps.

Figure 4:
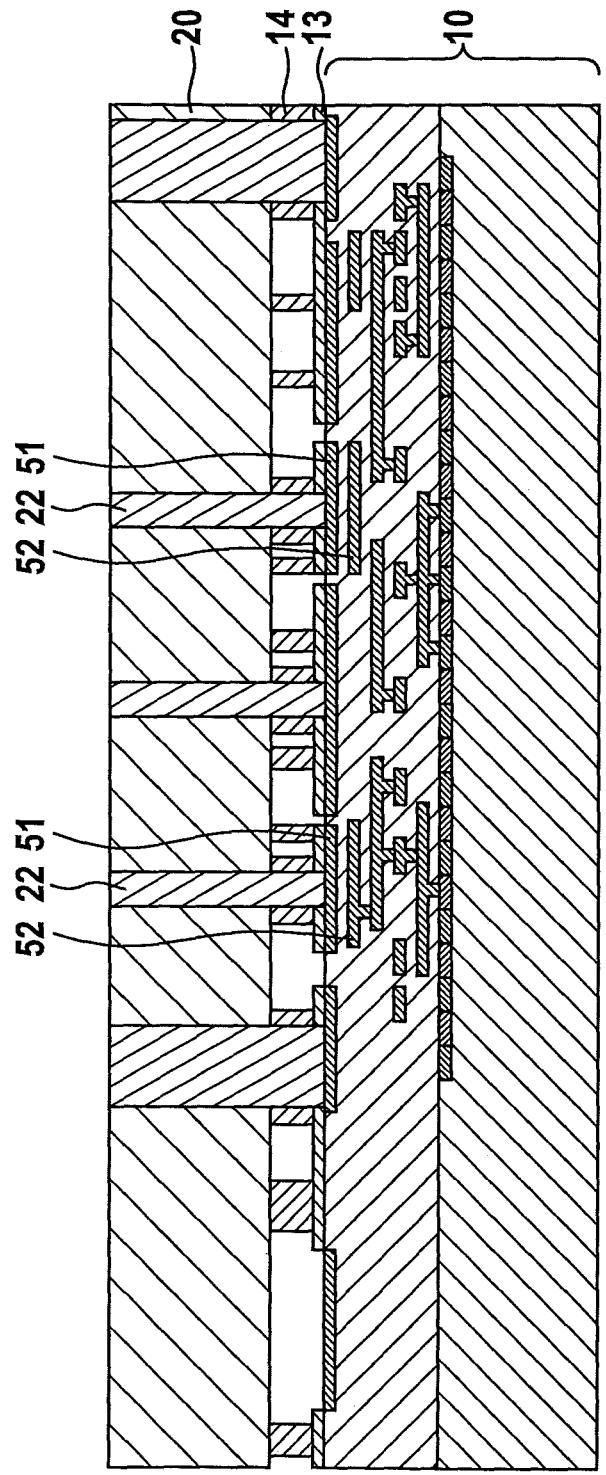

The first structuring step is used to produce through contacts, so-called vias 22. Passage openings having essentially circular cross sections are produced in MEMS substrate 20, which open into openings in standoff structure 14, specifically where passivation layer 13 has been opened for the electrical contacting of ASIC substrate 10. Such passage openings are also formed in particular in the area over electrodes 51 in first circuit level 1 of ASIC substrate 10. The passage openings typically have an aspect ratio of 5:1 to 20:1 and extend over the entire thickness of MEMS substrate 20. The walls of these passage openings are usually coated using a conductive diffusion barrier, for example, titanium nitride or titanium tungsten, before they are filled in a deposition process using an electrically conductive material 22, for example, copper or tungsten. FIG. 4 shows ASIC substrate 10 having MEMS substrate 20 after the filling of the passage openings and after the conductive material, which was deposited at this time on the surface of MEMS substrate 20, has been removed again.

In the exemplary embodiment shown here, the surface of MEMS substrate 20 has been provided over a part of vias 22 with a structured bond layer 31 for the mounting of a cap wafer.

Figure 5:
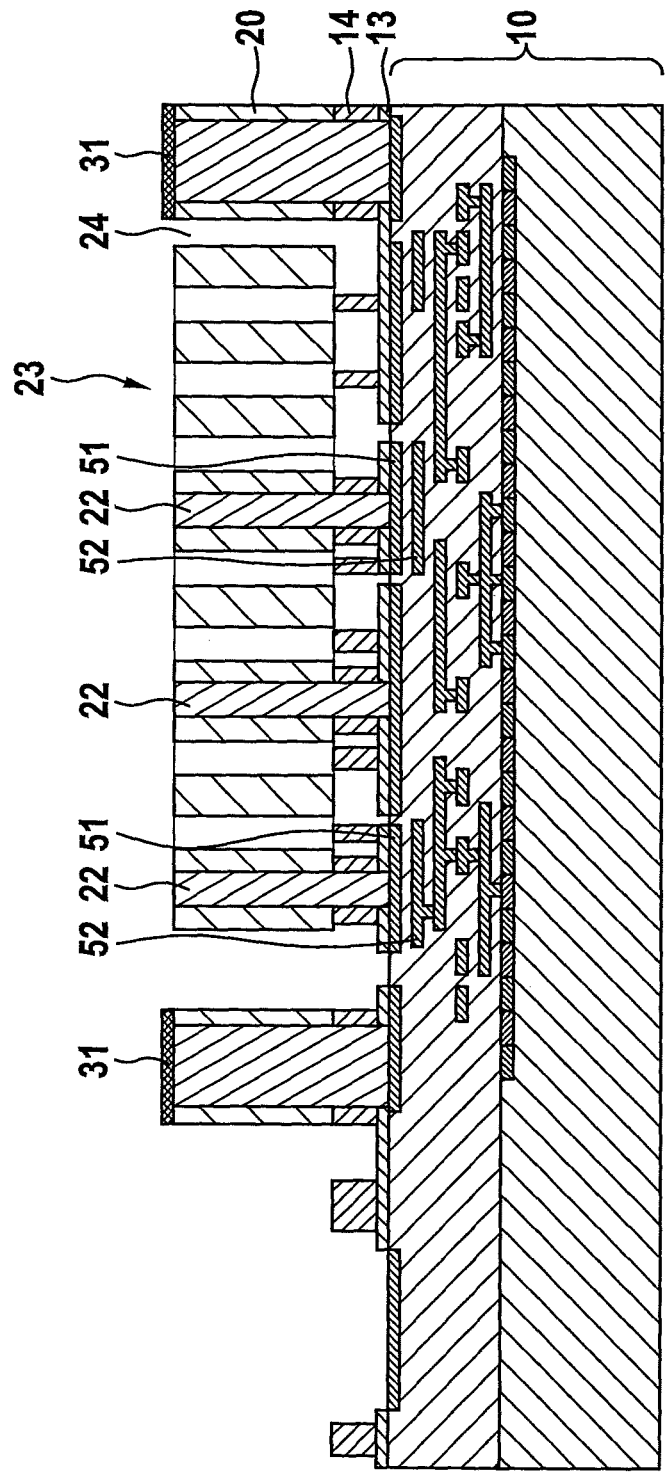

In the second structuring step, the micromechanical structure of the MEMS element is produced. It extends over the entire thickness of MEMS substrate 20, as shown in FIG. 5. A trenching process is preferably used both for the first and for the second structuring step, since structures having a particularly high aspect ratio may be produced using this method.

In the present case, the MEMS element is a z-acceleration sensor designed as a rocker. The micromechanical sensor structure includes a central resiliently mounted rocker structure 23 as the seismic mass, which is defined and exposed by trenches 24 in MEMS substrate 20. However, this rocker structure 23 is not yet freely movable after the structuring of MEMS substrate 20, since it is fixedly connected to ASIC substrate 10 at least via through contacts 22 and possibly also via the standoff structure in sacrificial layer 14.

Figure 6:
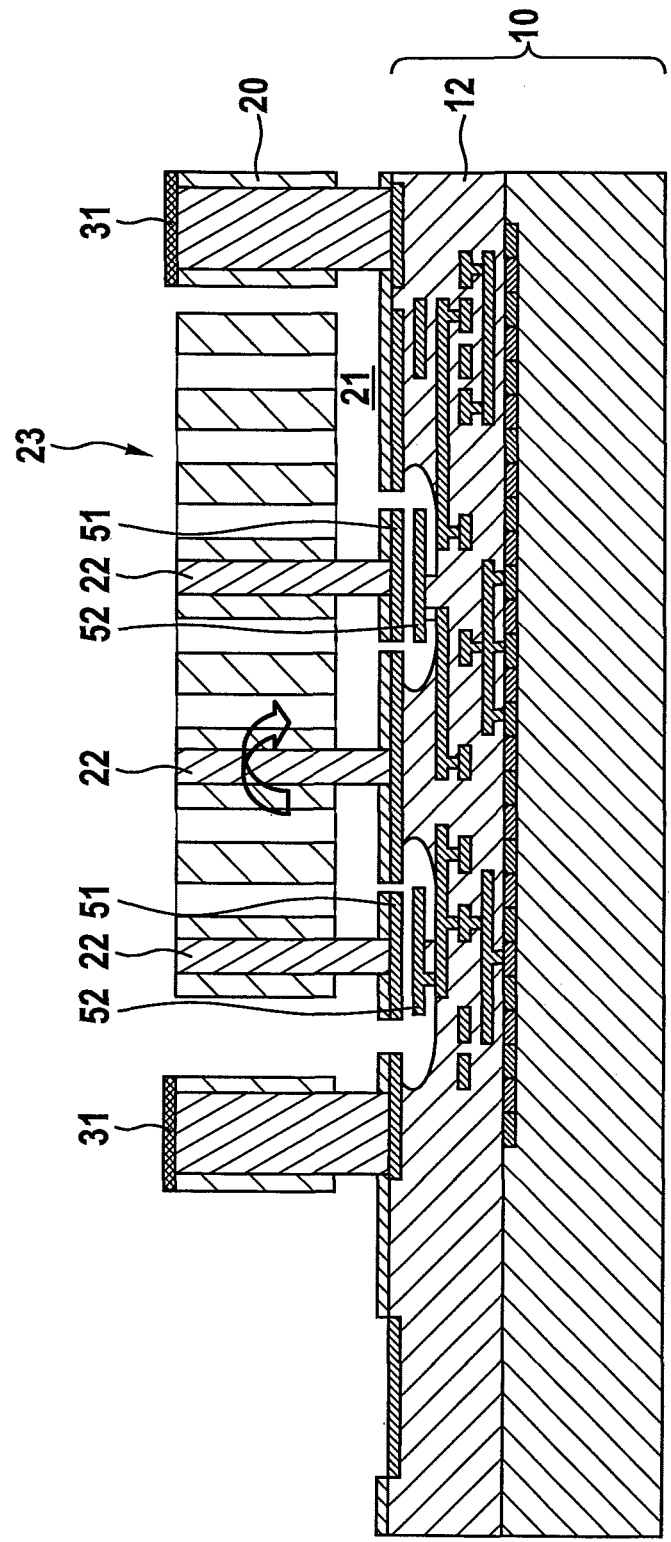

The ASIC-side separation of rocker structure 23 is preferably carried out in a one-step or possibly in a two-step sacrificial layer etching process, during which the oxide material of standoff structure 14 is initially removed. The material of insulating layer 12 in the surroundings of electrodes 51 and 52 in first and second circuit levels 1, 2 of ASIC substrate 10 is then also removed. The etching attack is carried out in each case via trenches 24 in the micromechanical structure, preferably by gas phase etching using HF. The result of this or these sacrificial layer etching process(es) is illustrated in FIG. 6. FIG. 6 shows that rocker structure 23 is resiliently connected to ASIC substrate 10 via a central through contact 22, which is identified with the arrow. The two electrodes 51 implemented in first circuit level 1 of ASIC substrate 10 are connected via the two laterally situated through contacts 22 both mechanically and electrically to rocker structure 23. In the event of an acceleration in the z direction, these two electrodes 51 are deflected or tilted together with rocker structure 23, since they have been separated from insulating layer 12 and therefore also from the composite of ASIC substrate 10. The electrode gap between movable electrode 51 and opposing stationary electrode 72 is enlarged on one side of rocker structure 23, while the electrode gap is reduced on the other side. Movable electrodes 51 thus form, together with stationary electrode 52 implemented in second circuit level 2, a measuring capacitor system, using which the deflections of rocker structure 23 as the differential capacitor may be detected. Since the individual layers of insulating layer 12 of ASIC substrate 10 are generally very thin, the electrode gap between electrodes 51 of first circuit level 1 and electrodes 52 of second circuit level 2 is also very small, so that the signal sensitivity in the case of the distance-capacitance conversion of the sensor element is very high.

It is also to be noted here that the mechanical connection between MEMS structure 23 and metal electrodes 51, which are separated from insulating layer 12, is not only used for stabilizing the position of these electrodes 51, but rather also effectively prevents bending of metal electrodes 51 and other aging effects.

Figure 7:
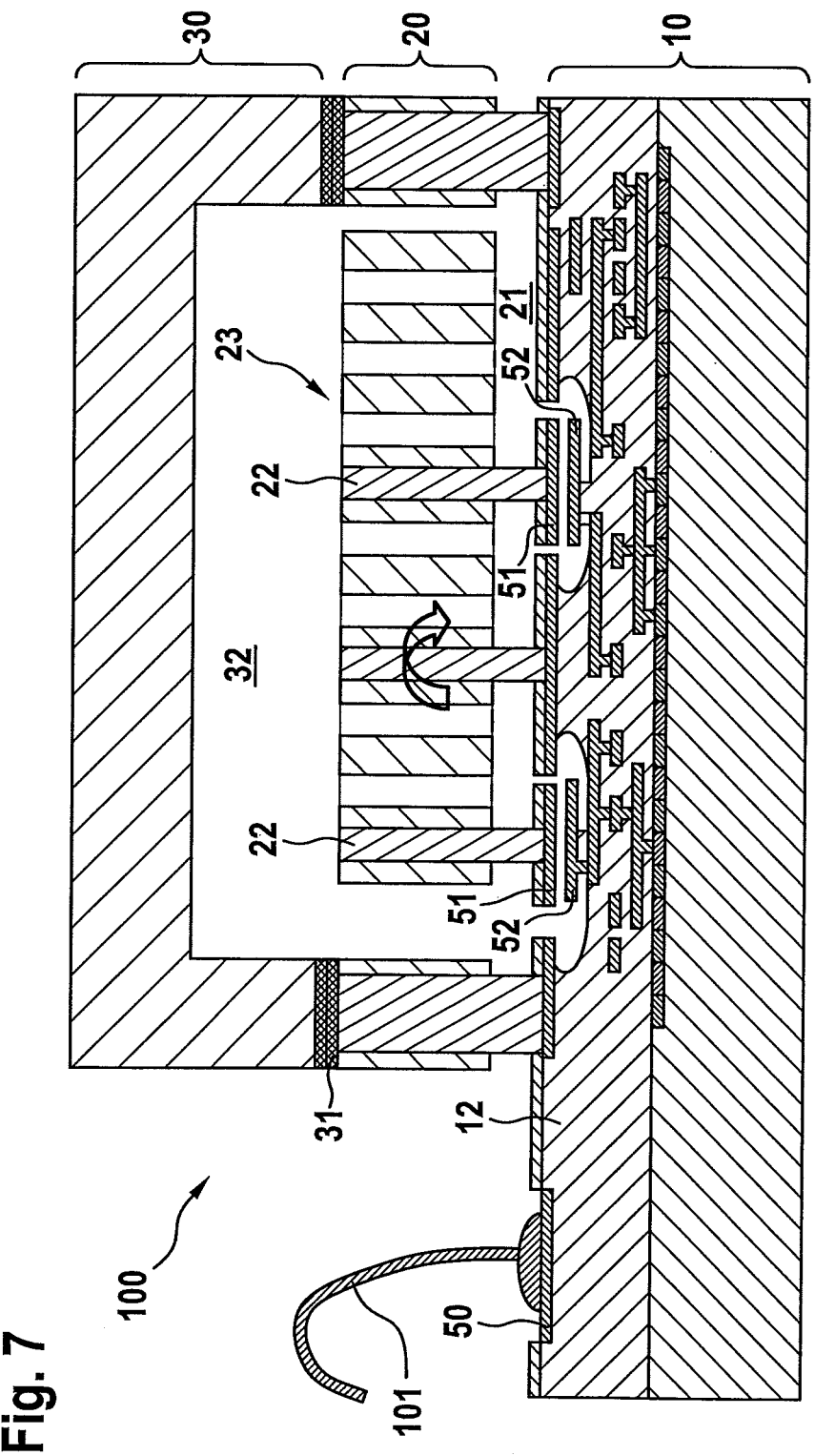
FIGS. 7 and 8 show schematic sectional views of two capped sensor components having external electrical contacting.

FIG. 7 shows a component 100, which has been manufactured proceeding from the wafer stack shown in FIG. 6, made of ASIC substrate 10 and MEMS substrate 20 having rocker structure 23. Before the separation of the components, a prestructured cap wafer 30 was also bonded over the sensor structure on MEMS substrate 20, in order to enclose the sensor structure hermetically sealed under defined pressure conditions in the cavity between ASIC substrate 10 and cap wafer 30. The individual components were only then separated from the wafer composite by sawing, for example.

Component 100 is placed within the scope of the second-level assembly on the ASIC side on a carrier, for example, a circuit board, and mechanically fixed there. The electrical contacting of component 100 is carried out here via an exposed terminal pad 50 in first circuit level 1, i.e., on the upper side of ASIC element 10 and via wire bonds 101 between this terminal pad 50 and the component carrier.

Figure 8:
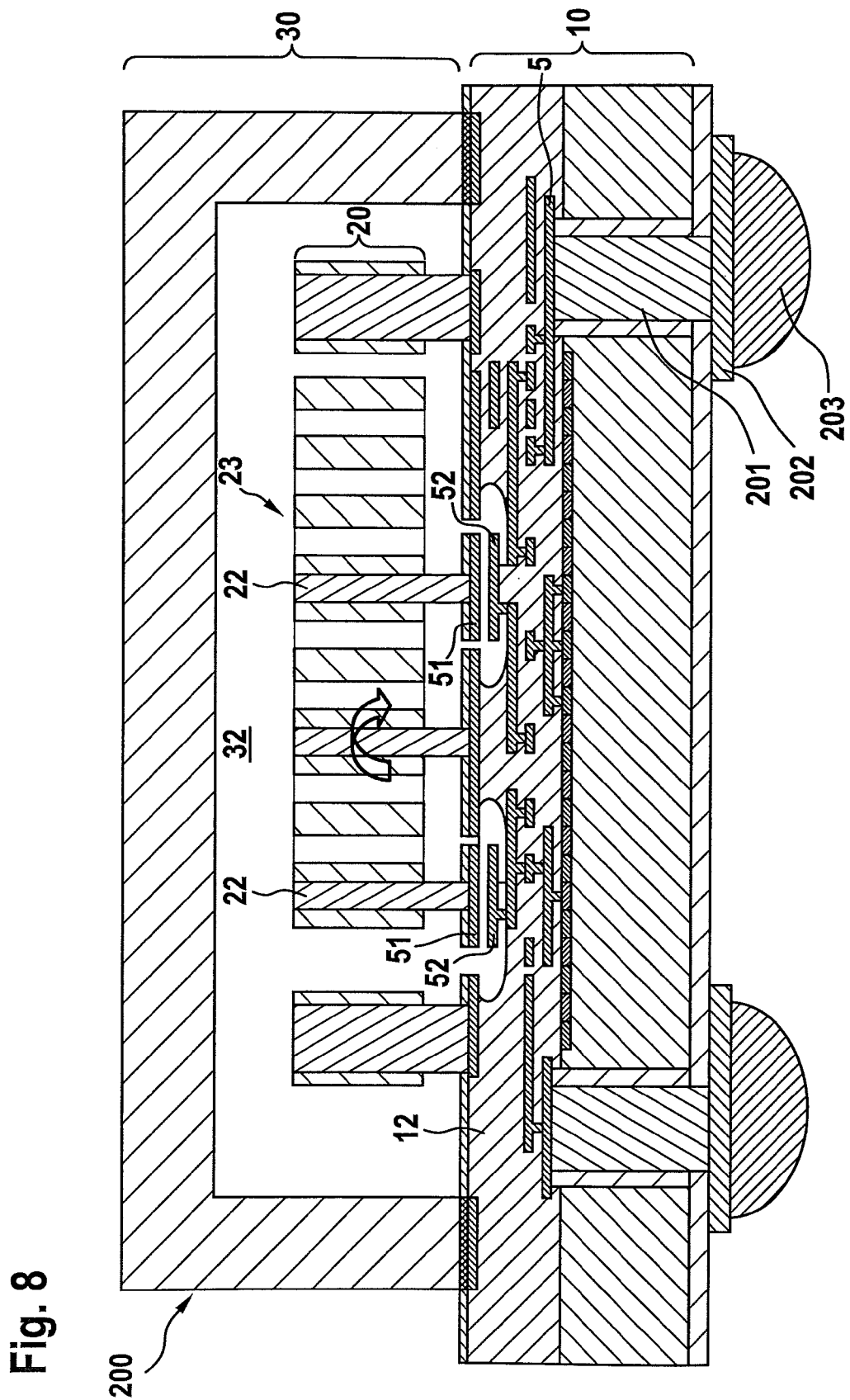

Another possibility for mounting a cap wafer on a wafer stack, as shown in FIG. 6, is shown in FIG. 8. A cap wafer 30 was also mounted here over the sensor structure of MEMS element 20, in order to close it hermetically sealed against the measuring environment. In the case of component 200 shown here, cap wafer 30 was connected to ASIC substrate 10, however, so that MEMS element 20 is completely situated in cavity 32 between ASIC substrate 10 and cap wafer 30. Component 200 is particularly well suited for direct mounting on circuit boards, since the electrical signals of component 200 are guided to the outside via through contacts 201, so-called TSVs (through silicon vias) in ASIC element 10. These TSVs 201 extend from lowermost circuit level 5 of ASIC element 10 up to its rear side, where terminal pads 202 are implemented. Both the mechanical fixing of component 200 on the circuit board and the electrical contacting may be established here easily with the aid of solder bumps 203.

Figure 9:
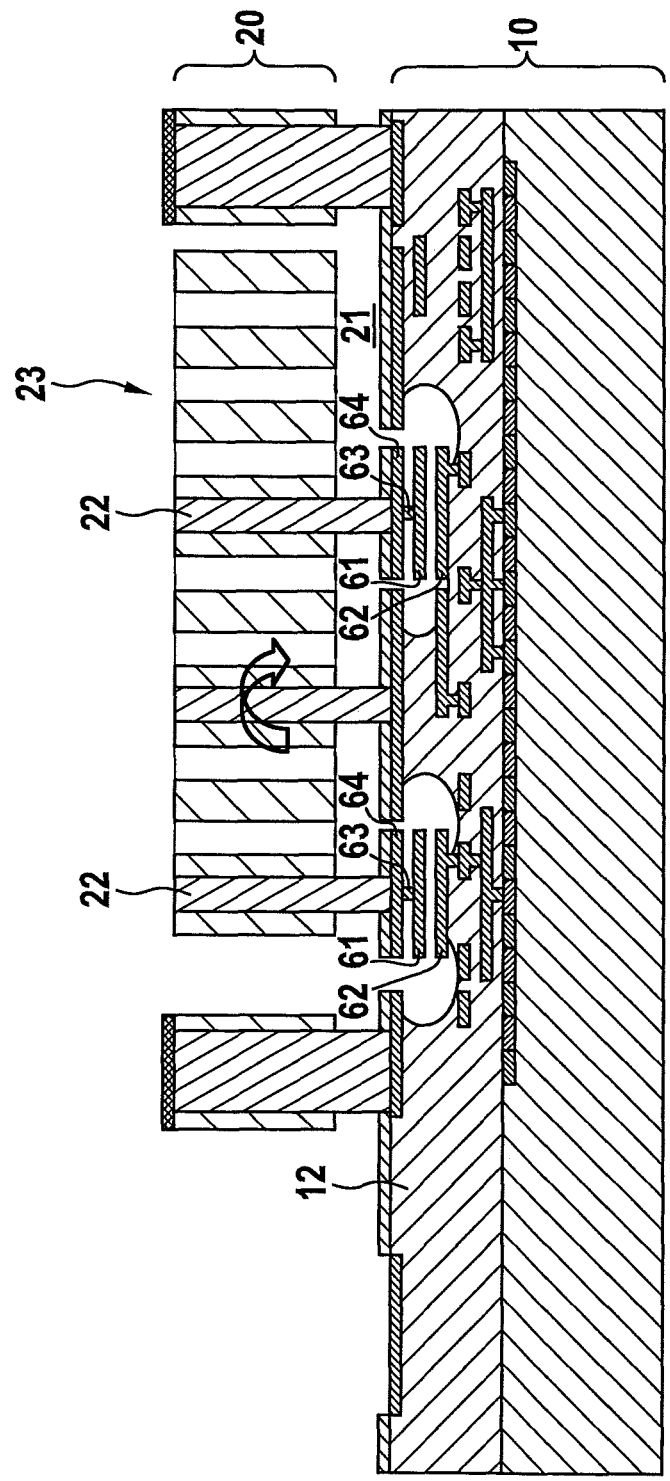
FIGS. 9 through 11 show schematic sectional views of MEMS/ASIC wafer stacks of three further sensor components according to the present invention having different capacitor systems.
Figure 10:
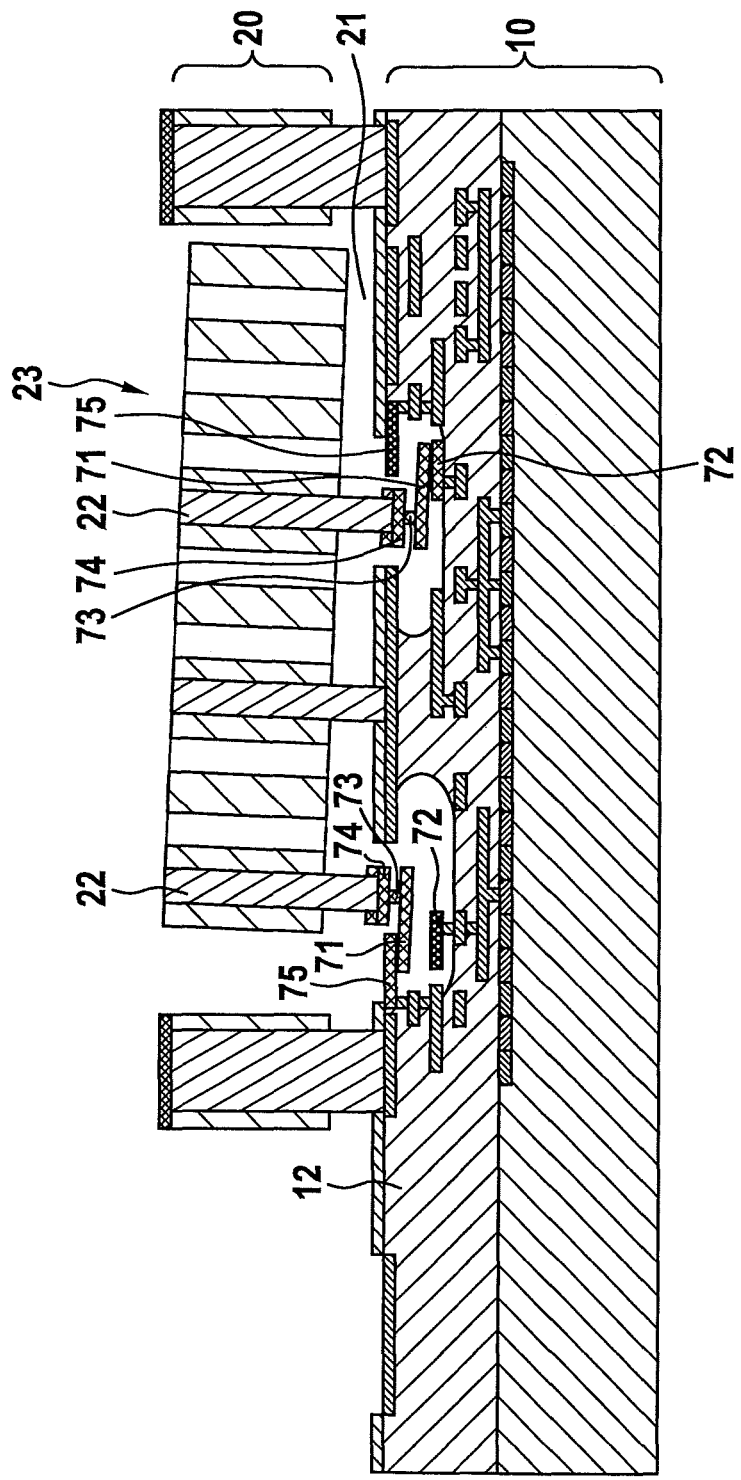
Figure 11:
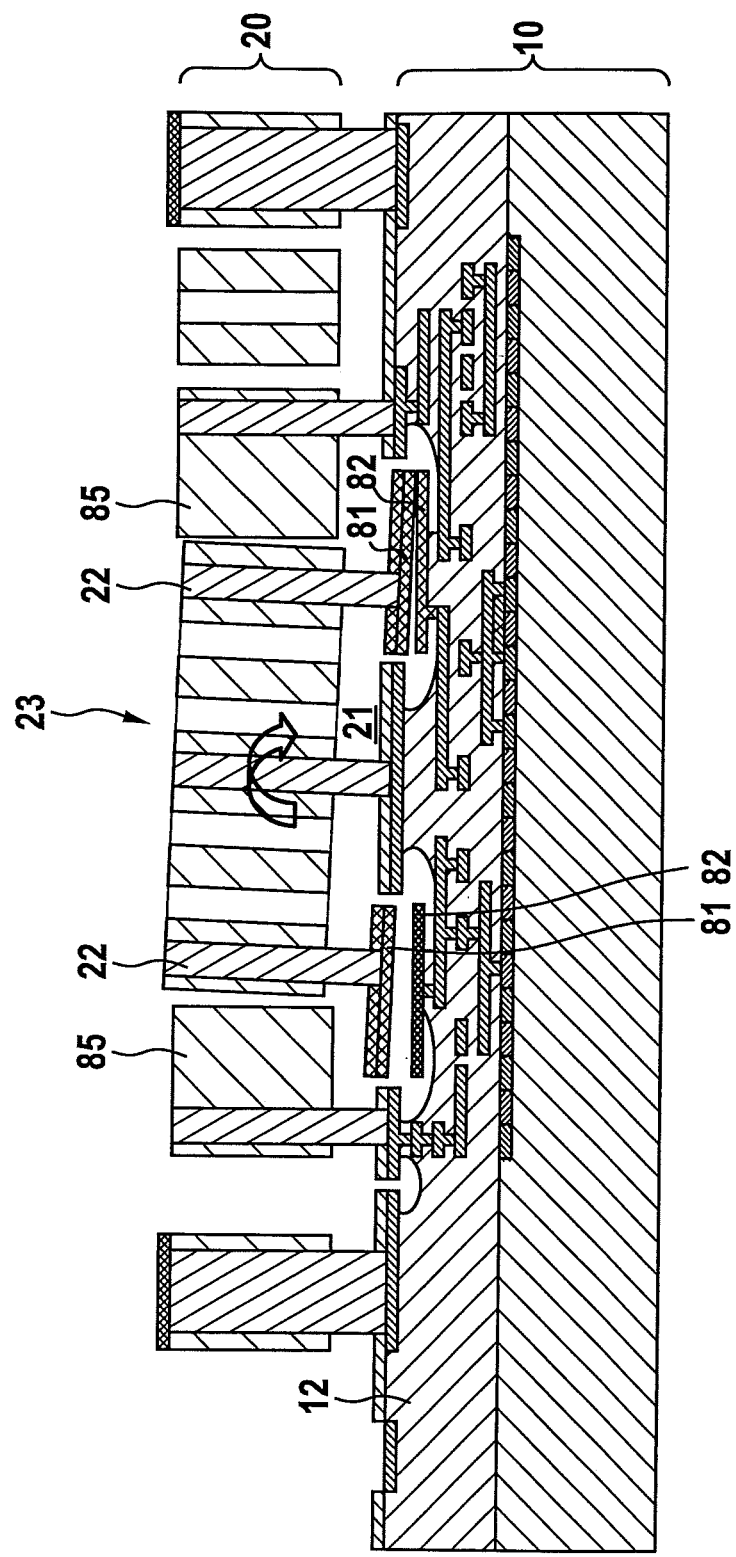

The wafer stacks shown in FIGS. 9 through 11, including an ASIC substrate 10 and a structured MEMS substrate 20, differ from the wafer stack of a component according to the present invention shown in FIG. 6 solely in the implementation of the measuring capacitor system. Therefore, in the following description of FIGS. 9 through 11, only the measuring capacitor system is explained in detail in each case. Reference is made to the description of FIGS. 1 through 6 with regard to the remaining components of the illustrated wafer stack.

While movable and stationary electrodes 51 and 52 of the measuring capacitor system shown in FIG. 6 are implemented in first and second circuit levels 1 and 2 of ASIC substrate 10, electrodes 61 and 62 of the measuring capacitor system in the case of FIG. 9 are electrodes of second and third circuit levels 2 and 3 of ASIC substrate 10. Movable electrodes 61 are implemented in second circuit level 2 and coupled via metallic support points 63 to terminal pads 64 in first circuit level 1, which are electrically and mechanically connected to MEMS structure 20 via through contacts 22. Terminal pads 64 are separated together with movable electrodes 61 from insulating layer 12 of ASIC substrate 10. Stationary electrodes 62 of the measuring capacitor system are applied below movable electrodes 61 in third circuit level 3. They are fixedly incorporated in insulating layer 12 of ASIC substrate 10. The measuring signal detection and evaluation is otherwise carried out here precisely as in the case of the measuring capacitor system shown in FIG. 6.

In contrast to the above-described capacitor systems, the measuring capacitor system shown in FIG. 10 includes three electrode levels. That is, the movable electrode is deflected within an electrode gap between two stationary electrodes. Stationary electrodes 72 and 75 of the measuring capacitor system shown here are implemented in first and third circuit levels 1 and 3 of ASIC substrate 10, while movable electrodes 71 are applied in second circuit level 2 of ASIC substrate 10 and are coupled via metallic support points 73 to terminal pads 74 in first circuit level 1. Terminal pads 74 are separated together with movable electrodes 71 from insulating layer 12 of ASIC substrate 10 and electrically and mechanically connected to MEMS structure 20 for this purpose via through contacts 22. Stationary electrodes 75 of first circuit level 1, which are positioned above movable electrodes 71, are implemented adjacent to terminal pads 74 and situated overlapping with movable electrodes 71. They are mechanically connected to lower circuit levels 2, 3 and therefore to ASIC substrate 10 via metallic support points 73. Stationary electrodes 72 of third circuit level 3 are applied below movable electrodes 71 and are fixedly incorporated in insulating layer 12 of ASIC substrate 10.

The deflections of rocker structure 23 may be detected using this measuring capacitor system on both sides of the resilient suspension in each case as a capacitance difference, which is shown by the tilted illustration of rocker structure 23 in FIG. 10. This fully differential measured value detection has proven to be advantageous, for example, if mounting-related or thermally-related mechanical tensions occur within the component, which result in a deflection of the rocker structure from the original rest position. In the case of a measuring capacitor system having only two electrode levels, as shown in FIGS. 6 and 9, this results in sensitivity and offset changes of the sensor. In the case of measuring capacitor systems having three electrode levels, the results of these effects on the sensor signal may be substantially eliminated, since the electrode gap on one side of a movable electrode increases to the same extent to which the electrode gap on the other side of this movable electrode decreases.

A fully differential measuring capacitor system having three electrode levels is also shown in FIG. 11. However, only movable electrodes 81 and one fixed electrode level are applied in the circuit levels of ASIC substrate 10 here. Movable electrodes 81 are structured out of first circuit level 1 and electrically and mechanically connected to MEMS structure 20 via through contacts 22. Stationary electrodes 82 are implemented in second circuit level 2 below movable electrodes 81 and are fixedly incorporated in insulating layer 12 of ASIC substrate 10. The third electrode level having stationary electrodes 85 above movable electrodes 81 is implemented here in the stationary edge area of MEMS structure 20, so that the deflections of rocker structure 23 on both sides of the resilient suspension may also each be detected as a capacitance difference in the case of FIG. 11.

What is claimed is:

1. A hybrid integrated component, comprising:
   at least one capacitor system including at least one movable electrode and at least one stationary electrode;
   an MEMS element including a micromechanical structure that extends over an entire thickness of the MEMS element, wherein at least one structural element of the micromechanical structure is deflectable and is operationally linked to the at least one capacitor system; and
   an ASIC element including the at least one stationary electrode, wherein:
      the MEMS element is mounted on the ASIC element so that there is a gap between the micromechanical structure and a surface of the ASIC element,
      the at least one movable electrode is separated from a layered structure of the ASIC element,
      the at least one movable electrode is mechanically and electrically connected to the deflectable structural element of the MEMS element, and
      the at least one movable electrode functions as the at least one movable electrode of the capacitor system.

2. The component as recited in claim 1, wherein the at least one stationary electrode of the capacitor system is integrated into the MEMS element.

3. The component as recited in claim 1, wherein the at least one stationary electrode of the capacitor system is integrated into the layered structure of the ASIC element.

4. The component as recited in claim 3, further comprising:
   a first structured metal layer electrically insulated by at least one insulating layer against a starting substrate of the ASIC element, the first structured metal layer being implemented on the ASIC element; and
   at least one further structured metal layer embedded in the at least one insulating layer, wherein at least one of the at least one movable electrode and the at least one stationary electrode is implemented in each case in at least two metal layers of the ASIC element.

5. The component as recited in claim 1, wherein:
   the mechanical and electrical connection between the deflectable structural element and the at least one movable electrode of the capacitor system is implemented as at least one through contact that extends through an entire thickness of the micromechanical structure and over the gap between the MEMS element and the ASIC element.

6. The component as recited in claim 1, wherein the micromechanical structure of the MEMS element is capped.

7. The component as recited in claim 1, further comprising:
   through contacts for an external contacting of the component and implemented in the ASIC element.

8. The component as recited in claim 7, further comprising:
   exposed terminal pads for the external contacting of the component and implemented on the ASIC element.

9. The component as recited in claim 1, wherein:
   the MEMS element includes a micromechanical sensor structure having at least one seismic mass that extends over an entire thickness of the MEMS element, and at least parts of a signal processing and evaluation circuit for sensor signals are integrated on the ASIC element.

10. A method for manufacturing a hybrid integrated component including an MEMS element and an ASIC element, comprising:
    initially processing an ASIC substrate and applying at least one electrode of at least one capacitor system;
    mounting an MEMS substrate on the ASIC substrate;
    producing in the MEMS substrate at least one through contact for a mechanical and electrical connection of the at least one electrode applied in the ASIC substrate;
    producing a micromechanical structure in the MEMS substrate, the micromechanical structure extending over an entire thickness of the MEMS substrate;
    exposing at least one structural element of the micromechanical structure on an ASIC side; and
    separating from a composite of the ASIC substrate the at least one electrode that is applied in the ASIC substrate and is connected via the at least one through contact to the at least one structural element.

11. The method as recited in claim 10, further comprising:
    within a scope of the processing of the ASIC substrate, producing a layered structure on a starting substrate that includes multiple metal layers embedded in at least one structured insulating layer, and one structured metal layer on an ASIC front side; and
    during a structuring of the multiple metal layers, implementing the at least one electrode of the at least one capacitor system.

12. The method as recited in claim 10, further comprising:
    producing a standoff structure on a front side of the processed ASIC substrate; and
    mounting the MEMS substrate on the standoff structure.

13. The method as recited in claim 10, wherein the connection between the MEMS substrate and the processed ASIC substrate is established in a bonding method.

14. The method as recited in claim 10, further comprising:
    after the mounting of the MEMS substrate on the processed ASIC substrate, thinning down the MEMS substrate to a predefined structural height of the micromechanical structure to be produced.

15. The method as recited in claim 10, further comprising:
    producing passage openings for through contacts in the MEMS substrate in a first structuring process;
    filling the passage openings with an electrically conductive material; and
    producing the micromechanical structure in a second structuring process.

16. The method as recited in claim 15, wherein the electrically conductive material includes one of tungsten and copper.

17. The method as recited in claim 10, wherein a structuring of the MEMS substrate is carried out in each case in a trenching process.

18. The method as recited in claim 10, further comprising:
separating at least one movable electrode of the at least one electrode of the capacitor system in a sacrificial layer etching process from the composite of the ASIC substrate, wherein in the separating a material of an insulating layer is at least regionally removed via trenches in the micromechanical structure of the MEMS substrate.

19. The method as recited in claim 10, further comprising:
providing a wafer stack including the ASIC substrate and the processed MEMS substrate with a pre-structured cap wafer, so that the micromechanical structure is hermetically sealed between the ASIC substrate and the cap wafer, and components are only separated thereafter.

* * * * *